United States Patent
Agarwal et al.

(10) Patent No.: US 7,547,578 B2
(45) Date of Patent: Jun. 16, 2009

(54) METHODS OF PROCESSING SEMICONDUCTOR WAFERS HAVING SILICON CARBIDE POWER DEVICES THEREON

(75) Inventors: Anant Agarwal, Chapel Hill, NC (US); Sei-Hyung Ryu, Cary, NC (US); Matthew Donofrio, Raleigh, NC (US)

(73) Assignee: Cree, Inc., Durham, NC (US)

(*) Notice: Subject to any disclaimer, the term of this patent is extended or adjusted under 35 U.S.C. 154(b) by 239 days.

(21) Appl. No.: 11/531,975

(22) Filed: Sep. 14, 2006

(65) Prior Publication Data

US 2007/0066039 A1    Mar. 22, 2007

Related U.S. Application Data

(60) Provisional application No. 60/718,140, filed on Sep. 16, 2005.

(51) Int. Cl.
*H01L 21/00* (2006.01)
*H01L 21/28* (2006.01)
*H01L 21/3205* (2006.01)
*H01L 21/44* (2006.01)

(52) U.S. Cl. .................. 438/113; 438/602; 438/666; 438/931

(58) Field of Classification Search .................. 451/433; 257/77; 438/113, 602, 666, 931
See application file for complete search history.

(56) References Cited

U.S. PATENT DOCUMENTS 5,851,664 A    12/1998  Bennett et al.
6,884,644 B1    4/2005  Slater
7,367,875 B2 *  5/2008  Slutz et al. ............ 451/443
2002/0179910 A1  12/2002  Slater
2004/0147120 A1   7/2004  Rogalli et al.
2005/0104072 A1 *  5/2005  Slater et al. ............ 257/77
2005/0151138 A1   7/2005  Slater
2006/0060877 A1   3/2006  Edmond
2006/0060879 A1   3/2006  Edmond
2006/0186418 A1   8/2006  Edmond

FOREIGN PATENT DOCUMENTS

WO    WO 01/86727    11/2001

OTHER PUBLICATIONS

Soloviev et al. (2000) "Doping of 6H-SiC by selective diffusion of boron" *Applied Physics Letters* 77(24): 4004-4006.
International Search Report and Written Opinion for International Application No. PCT/US2006/035516, mailed Feb. 14, 2007.

* cited by examiner

*Primary Examiner*—Davienne Monbleau
*Assistant Examiner*—Monica D Harrison
(74) *Attorney, Agent, or Firm*—Myers Bigel Sibley & Sajovec

(57) ABSTRACT

Methods of forming a silicon carbide semiconductor device are disclosed. The methods include forming a semiconductor device at a first surface of a silicon carbide substrate having a first thickness, and mounting a carrier substrate to the first surface of the silicon carbide substrate. The carrier substrate provides mechanical support to the silicon carbide substrate. The methods further include thinning the silicon carbide substrate to a thickness less the first thickness, forming a metal layer on the thinned silicon carbide substrate opposite the first surface of the silicon carbide substrate, and locally annealing the metal layer to form an ohmic contact on the thinned silicon carbide substrate opposite the first surface of the silicon carbide substrate. The silicon carbide substrate is singulated to provide a singulated semiconductor device.

36 Claims, 7 Drawing Sheets

US 7,547,578 B2

METHODS OF PROCESSING SEMICONDUCTOR WAFERS HAVING SILICON CARBIDE POWER DEVICES THEREON

RELATED APPLICATION

This application claims the benefit of and priority to U.S. Provisional Patent Application No. 60/718,140 entitled "METHODS OF PROCESSING SEMICONDUCTOR WAFERS HAVING SILICON CARBIDE POWER DEVICES THEREON AND SILICON CARBIDE POWER DEVICES SO FORMED," filed Sep. 16, 2005, the disclosure of which is hereby incorporated herein by reference as if set forth in its entirety.

FIELD OF THE INVENTION

This invention relates to microelectronic devices, and more particularly, to the fabrication of silicon carbide power devices.

BACKGROUND

The thickness of silicon-carbide (SiC) substrates in SiC-based power semiconductor devices can affect the forward voltage needed to operate the devices at a given current level. In particular, the performance and/or operation of SiC devices such as SiC Schottky diodes, MOSFETs, BJTs, PiN diodes, n-channel IGBTs, thyristors and/or vertical JFETs may be affected by the relatively high resistance of thick SiC substrates. For example, n-type, 4H-SiC substrates may account for about 1 mohm-cm$^2$ of the specific on-resistance of various devices. This may constitute about 50% of the on-resistance of a 600 V SiC Schottky diode, and/or about 90% of the on-resistance of a 300V SiC Schottky diode. A p-type 4H-SiC substrate may add about 50-100 mohm-cm$^2$ to the device on-resistance. For this reason, it has not been practical to develop vertical devices, such as GTOs and n-channel IGBTs, on p-type SiC substrates.

Present SiC device fabrication technology typically employs relatively thick (300-400 microns) substrates. Fabrication processing, including the backside ohmic contact anneal, may be performed on epilayers grown on the substrate. Since there may be subsequent processing steps after ohmic contact formation, the substrate is typically thick enough to provide adequate mechanical support for the epilayers. However, the thick substrate used for mechanical support may add to the electrical and/or thermal resistance of the device.

Ohmic contacts may be formed on SiC substrates at low/room temperatures by, for example, implanting ions into a surface of a SiC wafer on which the contact is to be formed. In some conventional approaches, the ohmic contacts may be formed by implantation of dopants into a backside of a SiC wafer. However, if an implanted doped SiC substrate is thinned prior to formation of ohmic contacts, the doped region may be removed during the thinning, which may make the implant superfluous. Accordingly, metals deposited for ultimately forming ohmic contacts may not have ohmic properties when deposited on the substrate, as the implant may be performed in a later step. Ion implantation for the formation of ohmic contacts is discussed, for example, in U.S. patent application Ser. No. 09/787,189, and in U.S. Patent Publication No. 2002/0179910, the disclosures of which are incorporated herein by reference in their entireties.

SUMMARY

Methods of forming a silicon carbide semiconductor device according to some embodiments of the invention include forming a semiconductor device at a first surface of a silicon carbide substrate having a first thickness and mounting a carrier substrate to the first surface of the silicon carbide substrate. The carrier substrate provides mechanical support to the silicon carbide substrate. The methods further include thinning the silicon carbide substrate to a thickness less than the first thickness, forming a metal layer on the thinned silicon carbide substrate opposite the first surface of the silicon carbide substrate, and locally annealing the metal layer to form an ohmic contact on the thinned silicon carbide substrate opposite the first surface of the silicon carbide substrate. The silicon carbide substrate is singulated to provide a singulated semiconductor device.

Thinning the silicon carbide substrate may include grinding and/or lapping the silicon carbide substrate while the carrier substrate provides mechanical support to the silicon carbide substrate. In particular, thinning the silicon carbide substrate may include grinding the silicon carbide substrate using an in-feed and/or creep feed grinder while the carrier substrate provides mechanical support to the silicon carbide substrate. In some embodiments, thinning the silicon carbide substrate may include etching the silicon carbide substrate while the carrier substrate provides mechanical support to the silicon carbide substrate.

Forming an electronic device may include forming a passivation layer on the first surface of the silicon carbide substrate, and mounting the carrier substrate to the first surface of the silicon carbide substrate may include attaching the carrier substrate to the passivation layer.

Locally annealing the metal layer may include locally heating the deposited metal layer to a temperature that may be sufficient to cause the metal layer to form an ohmic contact to the surface of the silicon carbide substrate opposite the first surface but that may be lower than a temperature at which the carrier substrate will detach from the silicon carbide substrate. In particular, locally heating the deposited metal layer may include laser annealing the deposited metal layer and/or electron beam annealing the deposited metal layer. Laser annealing may include impinging laser light having photon energies above a bandgap of the SiC substrate, and laser annealing may include impinging pulsed or continuous wave laser light.

The SiC substrate may include 4H SiC and/or 6H SiC, and laser annealing may include impinging laser light on the deposited metal layer. The laser light may have a wavelength of about 248 nanometers to about 308 nanometers.

The SiC substrate may include 6H SiC, and the laser light may be applied in a single pulse that may have a duration of about 30 nanoseconds. The laser light may be applied at an energy of about 2.8 joules/cm$^2$.

The SiC substrate may include 4H SiC, and the laser light may be applied in a plurality of pulses. For example, the laser light may be applied in about five pulses each having a duration of about 30 nanoseconds, and the laser light may be applied at an energy of about 4.2 joules/cm$^2$.

The methods may further include forming a metal overlayer on the ohmic contact. The metal overlayer may include an adhesion layer including Ti, a barrier layer including Ni and/or Ti/W, and a bonding layer including Ag and/or Au.

Thinning the substrate may include thinning the substrate to a thickness of about 120 microns or less. In some embodiments, thinning the substrate may include thinning the substrate to a thickness of about 80 microns to about 100 microns.

Methods of forming a silicon carbide semiconductor device according to further embodiments of the invention include forming an epitaxial layer on a surface of a silicon carbide substrate, forming a semiconductor device at a first surface of the epitaxial layer opposite the silicon carbide substrate, and mounting a carrier substrate to the first surface of the epitaxial layer. The carrier substrate may provide mechanical support to the epitaxial layer. The methods further include removing the silicon carbide substrate to expose a second surface of the epitaxial layer opposite the first surface, forming a metal layer on the second surface of the epitaxial layer, locally annealing the metal layer to form an ohmic contact on the second surface of the epitaxial layer, and separating the epitaxial layer from the carrier substrate.

Removing the silicon carbide substrate may include grinding and/or lapping the silicon carbide substrate while the carrier substrate provides mechanical support to the epitaxial layer. In particular, removing the silicon carbide substrate may include grinding the silicon carbide substrate using an in-feed and/or creep feed grinder while the carrier substrate provides mechanical support to the epitaxial layer. In some embodiments, removing the silicon carbide substrate may include etching the silicon carbide substrate while the carrier substrate provides mechanical support to the epitaxial layer.

Forming an electronic device may include forming a passivation layer on the first surface of the epitaxial layer, and mounting the carrier substrate to the first surface of the epitaxial layer may include attaching the carrier substrate to the passivation layer.

Locally annealing the metal layer may include locally heating the deposited metal layer to a temperature that may be sufficient to cause the metal layer to form an ohmic contact to the surface of the silicon carbide substrate opposite the first surface but that may be lower than a temperature at which the carrier substrate will detach from the epitaxial layer.

Methods of forming a silicon carbide semiconductor device according to further embodiments of the invention include forming a semiconductor device at a first surface of a silicon carbide substrate having a first thickness greater than about 300 microns, and mounting a carrier substrate to the first surface of the silicon carbide substrate. The carrier substrate provides mechanical support to the silicon carbide substrate. The methods further include thinning the silicon carbide substrate to a thickness of less than about 150 microns and forming an ohmic contact on the thinned silicon carbide substrate opposite the first surface of the thinned silicon carbide substrate.

Forming the ohmic contact may include forming a metal layer on the thinned silicon carbide substrate opposite the first surface of the silicon carbide substrate, and locally annealing the metal layer to form an ohmic contact on the thinned silicon carbide substrate opposite the first surface of the silicon carbide substrate.

Locally annealing the metal layer may include locally heating the deposited metal layer to a temperature that may be sufficient to cause the metal layer to form an ohmic contact to the surface of the silicon carbide substrate opposite the first surface but that may be lower than a temperature at which the carrier substrate will detach from the silicon carbide substrate.

Locally heating the deposited metal layer may include laser annealing the deposited metal layer and/or directing an electron beam at the metal layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
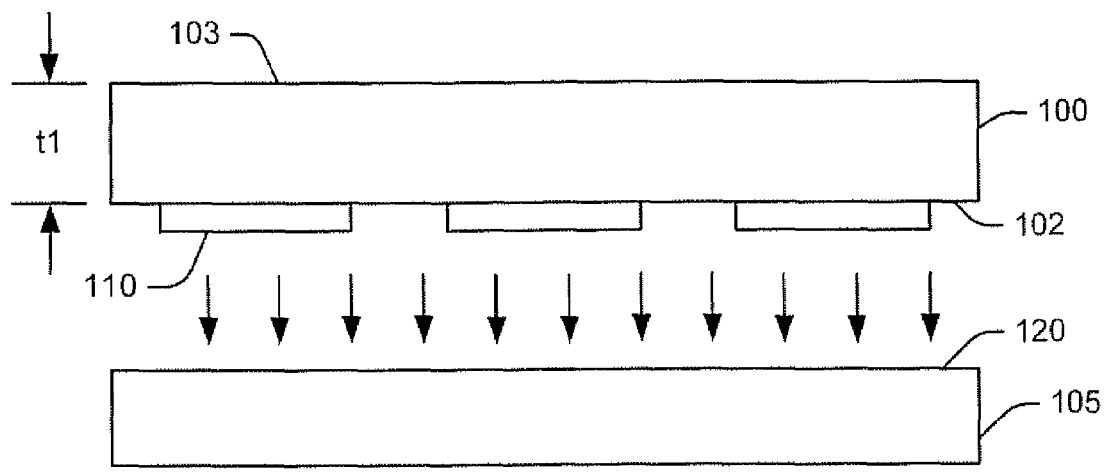
FIGS. 1A-1F are cross-sectional illustrations that illustrate methods of processing semiconductor wafers according to some embodiments of the invention.

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

As used herein the term "ohmic contact" refers to a contact having an impedance associated therewith that is substantially given by the relationship of Impedance=V/I, where V is a voltage across the contact and I is the current, at substantially all expected operating frequencies (i.e., the impedance associated with the ohmic contact is substantially the same at all operating frequencies). For example, in some embodiments according to the invention, an ohmic contact can be a contact with a specific contact resistivity of less than about $10^{-3}$ ohm-cm$^2$ and, in some embodiments less than about $10^{-4}$ ohm-cm$^2$.

As described herein in greater detail, embodiments according to the invention can provide methods of processing semiconductor wafers of semiconductor devices by, for example, reducing a thickness of a silicon carbide wafer having silicon carbide semiconductor devices formed thereon by processing the wafer from a backside thereof. A semiconductor wafer generally has two major parallel surfaces. As used herein, the term "backside" of a wafer refers to the major surface of the wafer opposite the surface of the wafer at which one or more semiconductor devices are formed.

As shown in FIG. 1A, a wafer (i.e., a substrate) 100 may typically have a thickness (t1) of about 300 microns to about 400 microns. A plurality of semiconductor devices 110 are formed on or at a front side 102 of the wafer 100 that is opposite a backside 103 of the wafer 100. It will be understood that the plurality of semiconductor devices 110 can be silicon carbide power semiconductor devices, such as PIN diodes, MOSFETs, IGBTs, etc. The semiconductor devices 110 may include one or more silicon carbide epitaxial layers/regions formed on the front side 102 of the wafer 100. The layers/regions may be formed, for example, by epitaxial growth and/or by ion implantation. The devices 110 may include an active region having a p-n junction for bipolar operation. In some embodiments of the invention, the devices 110 may include majority carrier devices, such as Schottky diodes, that do not include a p-n junction.

In some embodiments according to the invention, the wafer and/or associated epitaxial layers include silicon carbide of the 4H, 6H, 15R or 3C polytypes, or another type of material known to those skilled in the art, such as, for example, silicon, gallium arsenide, gallium nitride, aluminum nitride, aluminum gallium nitride, magnesium oxide (MgO), magnesium aluminate ($MgAl_2O_4$), lithium gallate ($LiGaO_2$), lithium aluminate ($LiAlO_2$), zinc oxide (ZnO), nickel aluminate ($NiAl_2O_4$), and/or sapphire While the devices 110 are illustrated in FIG. 1A as including mesas, it will be appreciated that the devices may not include mesas, and that device isolation, if required, may be achieved by other methods, such as, for example, junction isolation, trench isolation, and/or implant isolation.

The devices 110 may include, for example, silicon carbide-based power semiconductor devices such as SiC Schottky diodes, MOSFETs, BJTs, PiN diodes, n-channel IGBTs, thyristors and/or vertical JFETs. The devices 110 may further include silicon carbide-based GTOs and n-channel IGBTs on p-type substrates. The devices 110 may include other types of devices; thus, the foregoing list is not intended to be limiting.

FIG. 1A further illustrates a carrier substrate 105 on which an adhesive surface 120 is provided. The adhesive surface 120 may include, for example, wax and/or adhesive tape. The arrows in FIG. 1A indicate that the front side 102 of wafer 100 (including devices 110) is brought into contact with the adhesive surface 120 on the carrier substrate 105. The carrier substrate 105 may include any suitable material capable of providing mechanical support for the wafer 100, including devices 110 thereon, during subsequent processing steps. The carrier substrate 105 may include, for example, sapphire, silicon, aluminum, alumina, and/or any other suitable material.

Figure 1B:
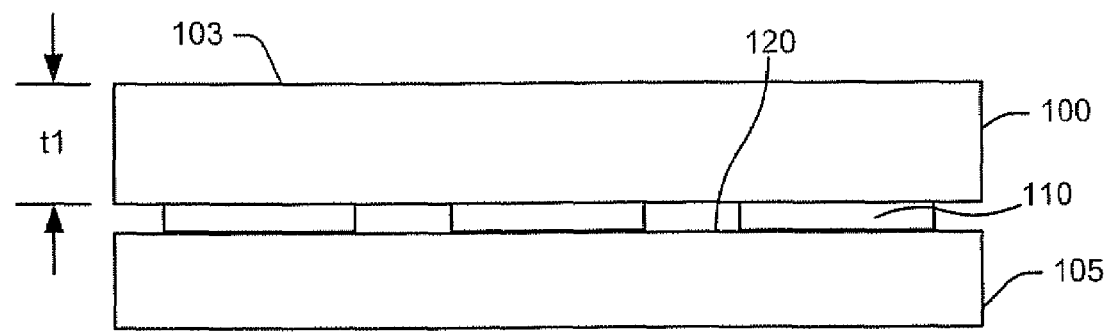

As shown in FIG. 1B, in some embodiments according to the invention, a wafer 100 (including the plurality of semiconductor devices 110) and a carrier substrate 105 are coupled together via an adhesive layer 120 in contact with the plurality of semiconductor devices 110 so that the assembly can be processed by, for example, mounting the carrier substrate 105 in a grinder (not shown) so that the backside 103 of the wafer 100 can be accessed. It will be understood that the wafer 100 including the plurality of semiconductor devices 110 thereon can be coupled to the carrier substrate 105 using any technique known to those skilled in the art, such as a wax, and that an adhesive layer 120 may be applied to the plurality of semiconductor devices 110 or to the carrier substrate 105. It will be further understood that the term "contact" includes direct contact as well as indirect contact where, for example, one or more intervening elements (such as the adhesive layer described above) are present between the wafer 100 and the carrier substrate 105 so that these two elements can be coupled together and the backside 103 of the wafer 100 can be processed while the wafer 100 is being supported by the carrier substrate 105.

Figure 1C:
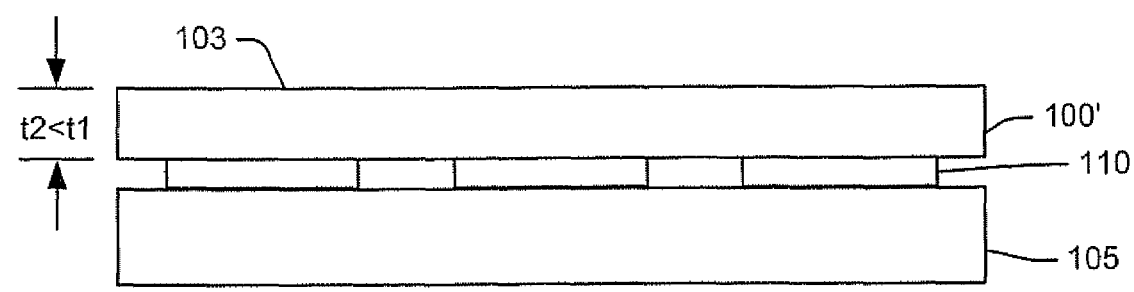

Referring to the embodiments of FIG. 1C, in some embodiments according to the invention, the backside 103 of the wafer 100 is processed to reduce the wafer 100 to a thickness t2, which is less than t1, to form a thinned wafer 100'.

In some embodiments according to the invention, the thickness of the wafer 100 is reduced using a grinder, such as an in-feed or creep feed grinder. In other embodiments according to the invention, the thickness of the wafer 100 is reduced using lapping, chemical or reactive ion etching or combinations of these approaches with or without grinding. In still other embodiments according to the invention, etching may be used to treat the backside of the thinned wafer to reduce damage to the wafer that may result from the thinning operation. Methods of thinning a wafer are described, for example, in commonly assigned U.S. patent application Ser. No. 10/987,135, filed Nov. 12, 2004 by Slater et al. entitled "Methods of Processing Semiconductor Wafer Backsides Having Light Emitting Devices (LEDs) There on and LEDs so Formed"; U.S. patent application Ser. No. 11/064,798, filed Feb. 23, 2005 by Edmond et al, entitled "Substrate Removal Process for High Light Extraction LEDs"; U.S. patent application Ser. No. 10/951,042, filed Sep. 22, 2004 by Edmond et al. entitled "High Efficiency Group III Nitride-Silicon Carbide Light Emitting Diode"; U.S. patent application Ser. No. 11/037,965, filed Jan. 18, 2005 by Edmond et al. entitled "High Output Small Area Group III Nitride LEDs", the disclosures of which are incorporated herein by reference in their entirety.

In some embodiments according to the invention, the wafer 100 is thinned to a thickness of less than about 150 microns. In other embodiments according to the invention, the wafer 100 is thinned to a thickness of less than about 120 microns. In further embodiments according to the invention, the wafer 100 is thinned to a thickness of from about 80 microns to about 100 microns or less. In some embodiments according to the invention, the wafer 100 is thinned using an in-feed grinder or a creep-feed grinder.

Figure 1D:
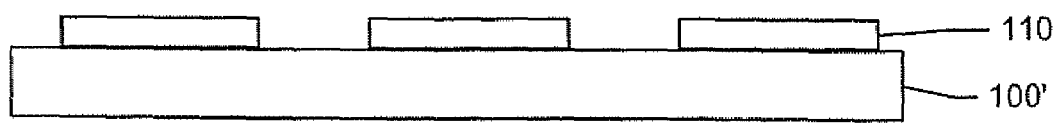

Once the backside 103 has been processed to sufficiently thin the wafer 100 (resulting in the formation of a thinned wafer 100'), the carrier substrate 105 can be removed from the assembly by, for example, heating the adhesive layer 120 so that the thinned wafer 100' and the plurality of semiconductor devices 110 thereon may be removed as shown in FIG. 1D. In other embodiments according to the invention, the carrier substrate 105 can be removed from the assembly using an appropriate solvent and/or by exposing the structure to ultraviolet light. For example, the adhesive layer 120 may be dissolved and/or melted to separate the carrier substrate 105 from the wafer 100'.

Figure 1E:
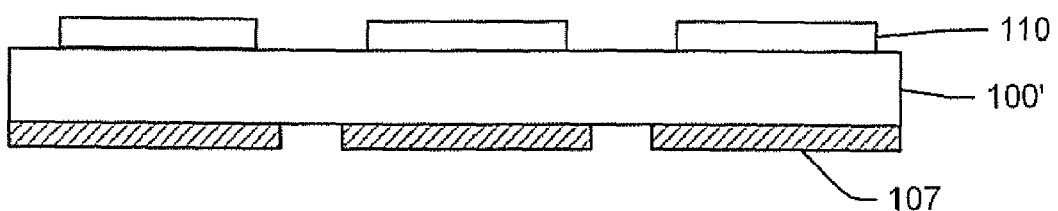

Referring to the embodiments of FIG. 1E, ohmic contacts 107 can be formed on the backside 103 of the wafer 100' using, for example, localized annealing as discussed in U.S. patent application Ser. No. 10/916,113, entitled "Localized Annealing of Metal-Silicon Carbide Ohmic Contacts and Devices So Formed" to Slater et al., filed Aug. 11, 2004, which is commonly assigned to the present assignee, the disclosure of which is incorporated herein by reference. It will be understood that the ohmic contacts can be formed on the thinned wafer 100' while the wafer 100' is coupled to the carrier substrate 105. In some embodiments according to the invention, the ohmic contacts can be formed on the thinned wafer 100' after the wafer is removed from the wafer carrier, as shown for example, in FIG. 1E. Ohmic contacts and/or bonding pads (not shown) can be formed on the plurality of semiconductor devices 110 opposite the ohmic contacts 107.

To form the ohmic contacts 107, a metal layer is formed on a back side of the SiC substrate 100' opposite the semiconductor devices 110. In particular, a layer of platinum, titanium, or nickel can be formed to a thickness of about 400 angstroms to about 1100 angstroms.

The metal layer is then annealed using a localized annealing technique, such as laser annealing. In laser annealing, the laser light used to anneal the metal-SiC ohmic contacts described herein can be a laser light having a wavelength and intensity sufficient to form the metal-silicide material at the interface of the metal layer and the thinned SiC substrate 100'. For example, in embodiments using 6H SiC as the substrate, laser annealing may be accomplished by impinging laser light having a wavelength of about 248 nanometers to about 308 nanometers at an energy of about 2.8 joules per square centimeter in a single pulse having a duration of about 30 nanoseconds. In other embodiments according to the invention where, for example, the SiC substrate is 4H SiC, the laser light may have a wavelength of about 248 nanometers to about 308 nanometers and an energy of about 4.2 joules per square centimeter applied in about 5 pulses, each having a duration of about 30 nanoseconds. In still other embodiments according to the invention, other wavelengths and energies may be used to provide annealing at the interface location of the metal layer and the SiC substrate via absorption of light including photon energies that are above the bandgap of the SiC substrate. It will be understood that pulsed and/or continuous loop lasers may also be utilized.

Electron beam annealing may be used as an alternative to laser light. Accordingly, an electron beam may be used to anneal the interface locations of the metal layer and the SiC substrate to form the metal-SiC material thereat.

Figure 1F:
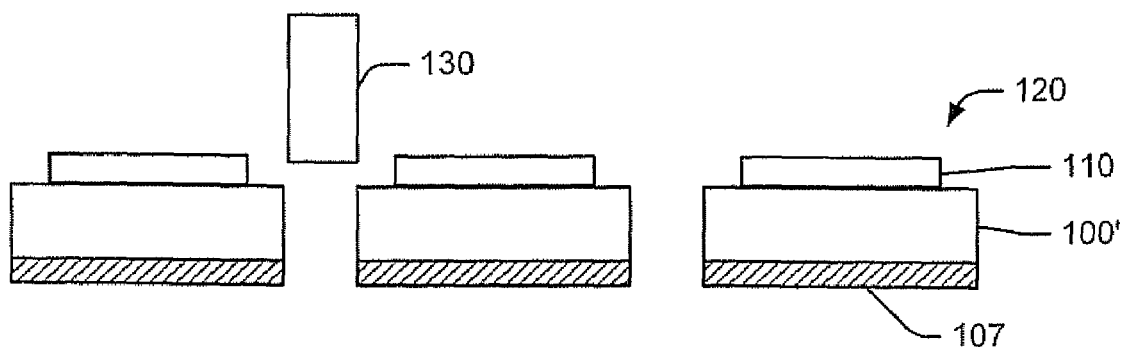

Referring to the embodiments of FIG. 1F, the plurality of semiconductor devices 110 may be separated from one another by, for example, breaking the thinned wafer 100' and/or partially or completely cutting through the entire wafer 100 with a dicing saw. For example, a saw blade 130 can be used to cut the wafer 100' to separate the plurality of semiconductor devices 110 for packaging. It will be understood that the saw blade 130 can cut through the entire wafer 100' to form straight edges on the thinned wafer 100' between the separated plurality of semiconductor devices 110 or substantially through the thinned wafer 100' so that the semiconductor devices 110 may be separated from one another by applying pressure along score lines formed by the saw blade 30.

Figure 2A:
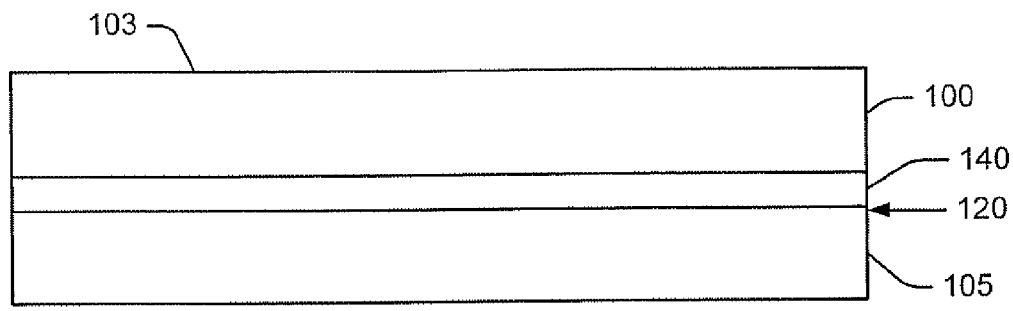
FIGS. 2A-2D are cross-sectional illustrations that illustrate methods of processing semiconductor wafers according to some embodiments of the invention.
Figure 2B:
Figure 2C:
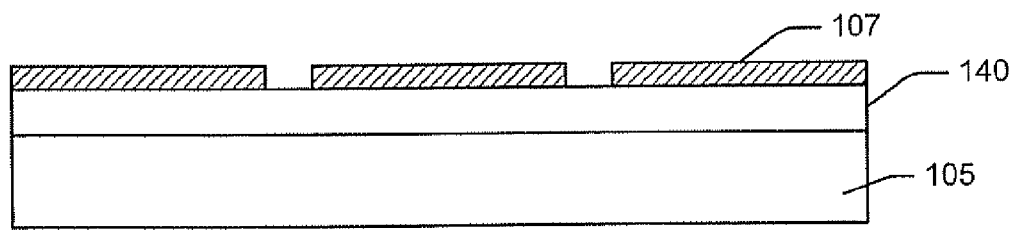

In some embodiments according to the invention, one or more layers may be formed on a substrate to a thickness such that the substrate may be removed from the layers altogether. In some embodiments, the layers may include epitaxial layers grown on the substrate. However, the layers may include implanted layers. For example, referring to the embodiments of FIGS. 2A-2D, a substrate 100 on which one or more epitaxial layers 140 have been formed may be affixed to a carrier substrate 105 by an adhesive layer 120 as illustrated in FIG. 2A.

As in the embodiments of FIGS. 1A-1F, the carrier substrate 105 may include sapphire, silicon, alumina or any other suitable material, while the adhesive layer 120 may include wax, adhesive tape, or any other suitable adhesive material. In order to provide adequate mechanical stability, the epitaxial layers 140 may be grown to a thickness of at least about 3 microns to about 10 microns or more.

The substrate 100 may be removed from the epitaxial layer 140 using a grinder, such as an in-feed or creep feed grinder. In other embodiments according to the invention, the wafer 100 may be removed by lapping, chemical or reactive ion etching or combinations of these approaches with or without grinding. A selectivity of the grinding or other thinning process may allow a transition from the substrate 100 to the epitaxial layer 140 to provide an end point to the thinning.

Ohmic contacts 107 can be formed on the epitaxial layer 140 using, for example, laser annealing as described above. The ohmic contacts 107 can be formed on the epitaxial layer 140 while the epitaxial layer 140 is coupled to the carrier substrate 105, as shown for example, in FIG. 2C. However, in some embodiments according to the invention, the ohmic contacts 107 can be formed on the epitaxial layer 140 after the epitaxial layer 140 is removed from the carrier substrate 105.

Figure 2D:
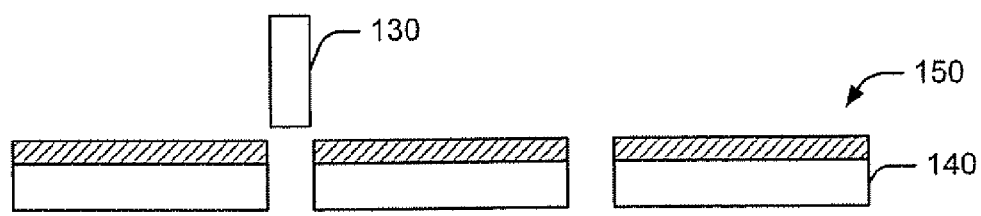

The epitaxial layer 140 may then be removed from the carrier substrate 105 and diced, for example using a dicing saw 130, to form singulated devices 150, as shown in FIG. 2D. In some embodiments, the devices 150 may be singulated (i.e. separated into individual devices) using a scribe-and-break process instead of and/or in addition to sawing.

Further embodiments according to the invention are illustrated in FIGS. 3A-3J, in which the formation of Schottky diodes according to some embodiments of the invention is illustrated. It will be appreciated, however, that methods according to embodiments of the invention may be employed to fabricate many different types of power semiconductor devices, including, for example, SiC MOSFETs, BJTs, PiN diodes, n-channel IGBTs, thyristors and vertical JFETs, as well as GTOs and n-channel IGBTs on p-type substrates.

Figure 3A:
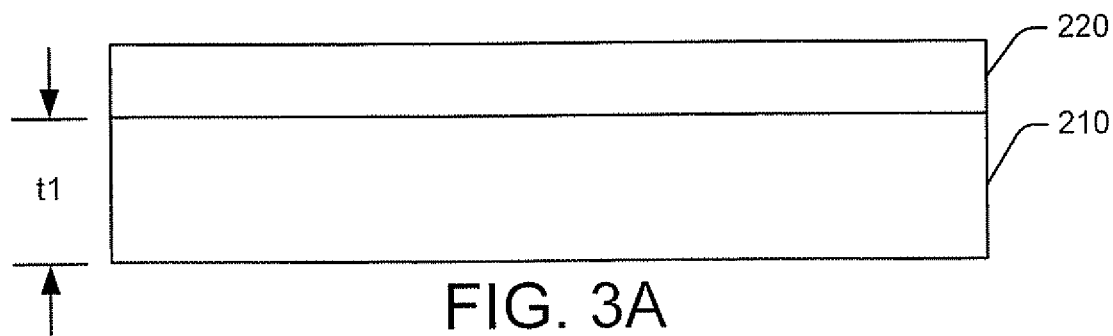
FIGS. 3A-3J are cross-sectional illustrations that illustrate methods of processing semiconductor wafers according to some embodiments of the invention.

Referring to the embodiments of FIG. 3A, an epitaxial layer 220 is formed on a substrate 210, which may have an initial thickness of about 300 microns to about 400 microns. In the illustrated embodiments, the epitaxial layer 220 includes n-type silicon carbide having a thickness from about 3 microns to about 10 microns. However, the epitaxial layer 220 may have other thicknesses and/or conductivity types. The epitaxial layer 220 may include a plurality of epitaxial layers which are used in the resulting devices. The substrate 210 may include any suitable silicon carbide substrate. In some embodiments, the substrate 210 may include an n+ 4H silicon carbide substrate that is cut 8° off-axis to the (0001) plane.

Figure 3B:
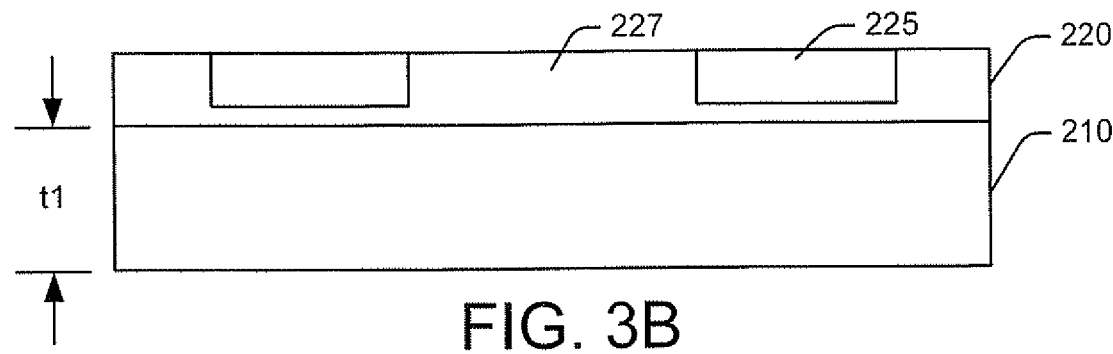
Figure 3C:
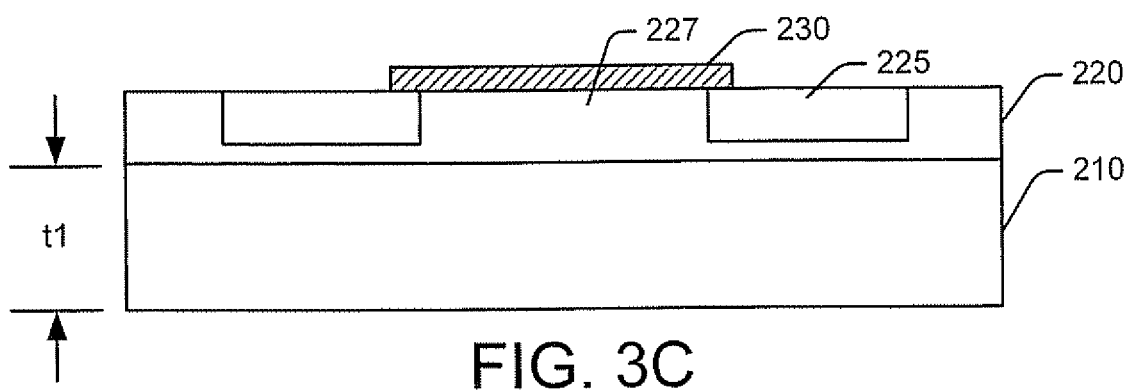
Figure 3D:
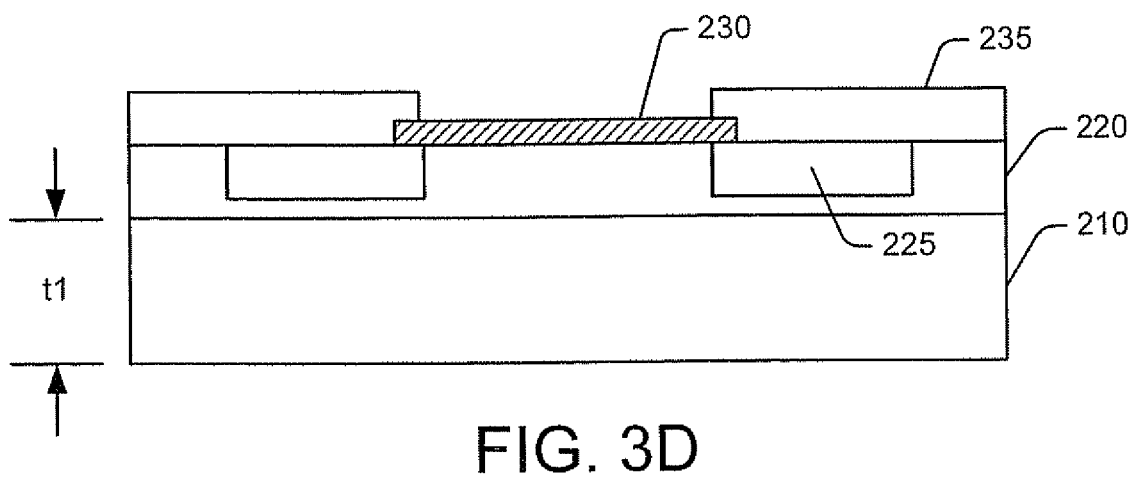

A device may be defined in the epitaxial layer 220 as follows. First, as shown in FIG. 3B, edge termination regions 225 may be implanted in the epitaxial layer 220 to define an active device area 227 within the termination regions 225. Metal contacts, including a Schottky contact 230 are formed on the active device area 227 (FIG. 3C). A field passivation layer 235 is deposited on the surface of the structure. In some embodiments according to the invention, the passivation layer may be patterned to reveal the Schottky contact 230 as illustrated in FIG. 3D. However, it will be appreciated that in some embodiments of the invention, the passivation layer 235 may not be patterned until a subsequent processing step, for example, after the wafer carrier has been removed.

Figure 3E:
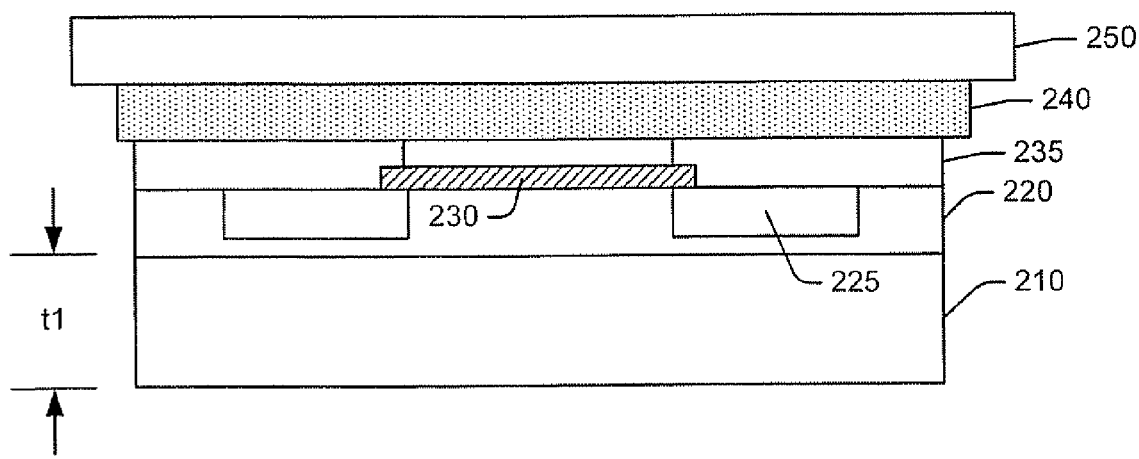

Referring now to the embodiments of FIG. 3E, a wafer carrier 250 is affixed to the front side of the substrate 210 by means of an adhesive layer 240. As described above, the wafer carrier 250 may include sapphire, silicon, alumina or any other suitable material, while the adhesive layer 240 may include wax, adhesive tape, or any other suitable adhesive material.

Figure 3F:
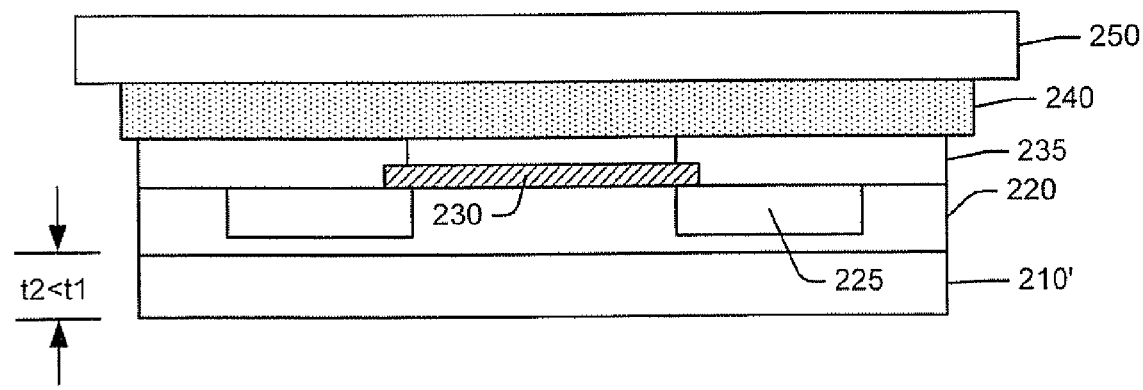

The backside 212 of the substrate 210 is then thinned and/or removed by grinding, lapping, chemical or reactive ion etching or combinations of the foregoing, as described above. In the embodiments illustrated in FIGS. 3A-3J, the substrate 210 has an initial thickness t1 and is subsequently thinned to a second thickness t2, which is less than t1, as illustrated in FIG. 3F. In some embodiments, the initial thickness t1 is from about 300 microns to about 400 microns, while the second thickness is from about 80 microns to about 100 microns. In some embodiments, the substrate 210 may be completely removed from the epitaxial layer 220.

Figure 3G:
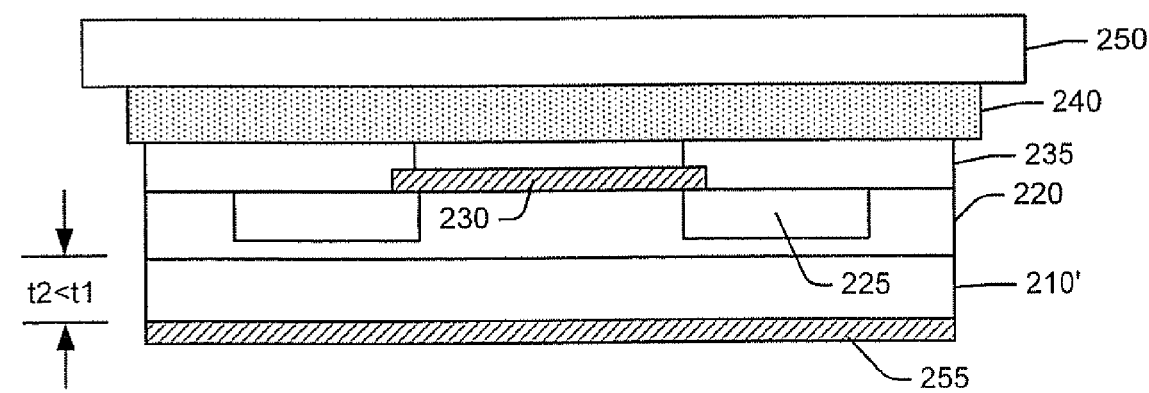
Figure 3H:
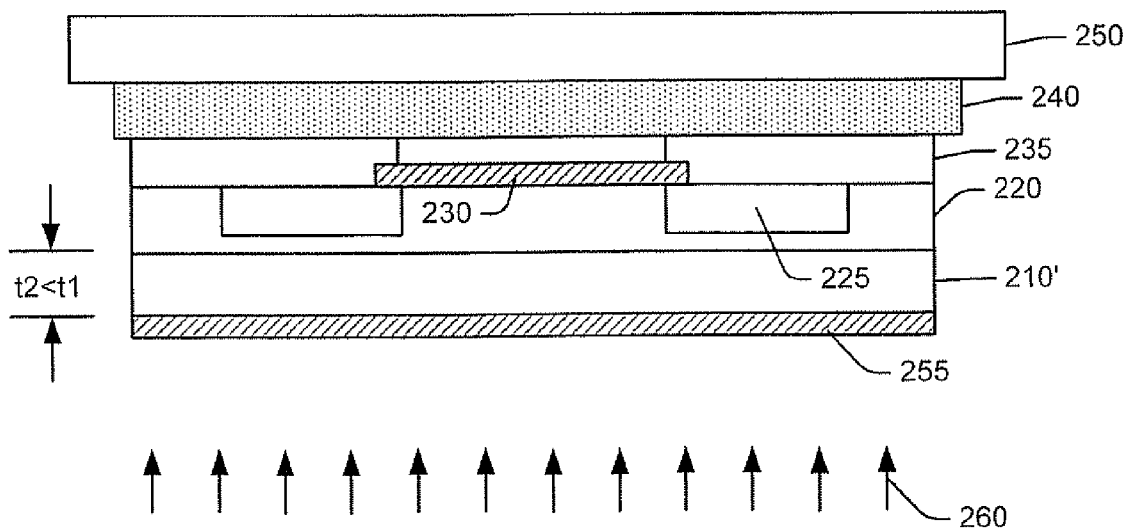

Referring to FIG. 3G, an ohmic contact 255 may be formed on the backside of the thinned wafer 210'. As shown in FIG. 3H, the ohmic contact 255 may be locally annealed in the manner described above. Localized annealing may be employed to anneal the ohmic contact 255 on the backside of the thinned wafer 210' without substantially heating the front side of the thinned wafer and the associated device structures. For example, laser annealing may be employed to anneal the ohmic contact 255 on the backside of the thinned wafer 210' without causing the wafer carrier 250 to separate from the epitaxial layer 220.

It will be understood that the laser light used to anneal the metal-SiC ohmic contacts described herein can be a laser light having a wavelength and intensity sufficient to form the metal-silicide material at the interface of the metal layer and the SiC substrate. For example, in embodiments using 6H SiC as the substrate, laser annealing may be accomplished by impinging laser light having a wavelength of about 248 nanometers to about 308 nanometers at an energy of about 2.8 joules per square centimeter in a single pulse having a duration of about 30 nanoseconds. In other embodiments according to the invention where, for example, the SiC substrate is 4H SiC, the laser light may have a wavelength of about 248 nanometers to about 308 nanometers and an energy of about 4.2 joules per square centimeter applied in about 5 pulses, each having a duration of about 30 nanoseconds. In still other embodiments according to the invention, other wavelengths and energies may be used to provide annealing at the interface location of the metal layer and the SiC substrate via absorption of light including photon energies that are above the bandgap of the SiC substrate. It will be understood that pulse and/or continuous loop lasers may also be utilized.

Electron beam annealing may be used as an alternative to laser light. Accordingly, an electron beam may be used to anneal the interface locations of the metal layer and the SiC substrate to form the metal-SiC material thereat.

Figure 3I:
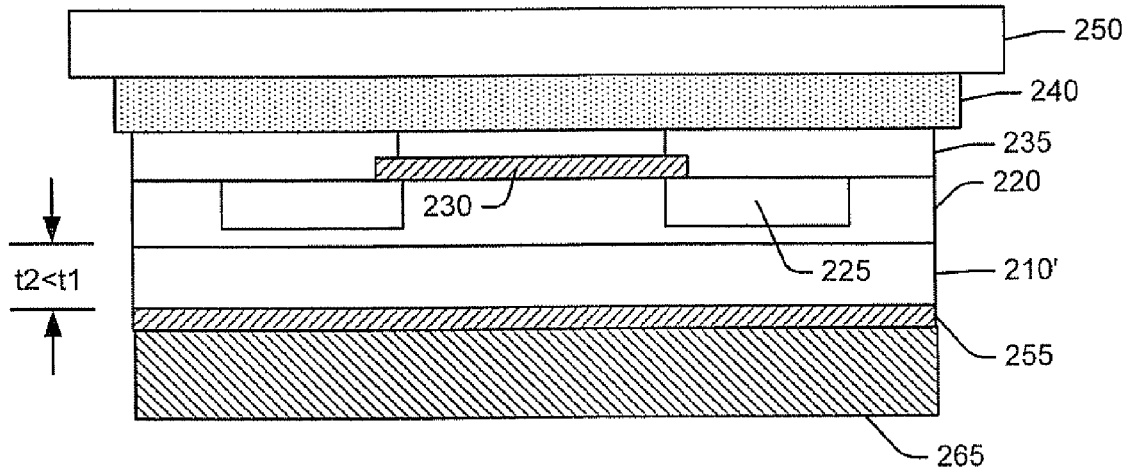

A backside metal overlayer 265 may be applied to the ohmic contact 255, as shown in FIG. 3I. The backside metal overlayer 265 may include, for example, stacks of adhesion, barrier and bonding layers such as Ti/Ni/Ag and/or Ti/TiW/Au.

Figure 3J:
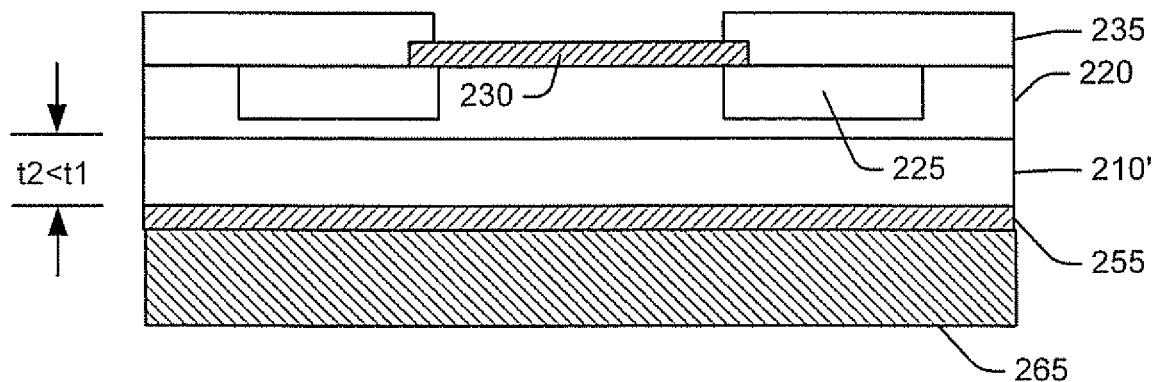

Finally, as illustrated in FIG. 3J, the wafer carrier 250 may be removed from the epitaxial layer 220 by heating the adhesive layer 240, using an appropriate solvent to dissolve the adhesive layer 240, and/or by exposing the adhesive layer 240 to ultraviolet light.

Devices formed in accordance with embodiments of the invention may exhibit reduced on-resistance. In particular, some embodiments of the invention can be used to reduce device area for a given on-resistance, which may result in higher device yield and/or lower cost for silicon carbide power devices.

Figure 4:
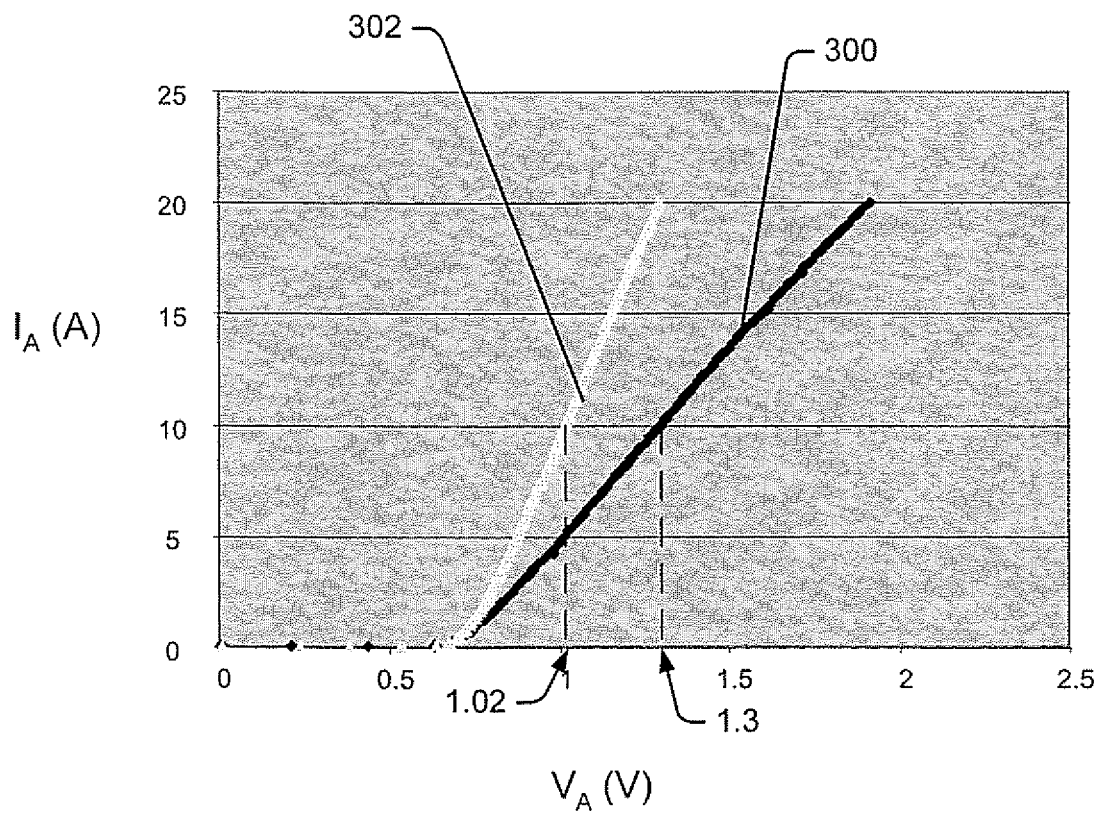
FIG. 4 is a graph of current versus voltage for a conventional SiC Schottky device and a SiC Schottky device formed according to some embodiments of the invention.

The reduction of on-resistance may be more pronounced for low voltage devices. For example, FIG. 4 shows curves of the forward current-voltage (I-V) characteristics of 300 V 4H-SiC Schottky diodes for a device formed according to some embodiments of the invention (curve 302) and a conventional SiC Schottky diode (curve 300). In particular, the conventional device had an approximately 400 micron thick substrate, while the device formed according to some embodiments of the invention had an approximately 100 micron thick substrate. The current rating of the diodes was 10 A. Current-voltage measurements were taken at room temperature. As shown in FIG. 4, the forward voltage drop of the conventional diode at a forward current of 10 A was about 1.3 V. In contrast, the forward voltage drop of the diode formed according to embodiments of the invention was about 1.02 V at 10 A, which represents an approximately 23% reduction in forward voltage. The resistive drop, which is calculated from the knee voltage (approximately 0.7 V) was reduced from about 0.6 V to about 0.3 V, which is a reduction of 50%.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a silicon carbide semiconductor device comprising:
    providing a semiconductor device at a first surface of a silicon carbide substrate having a first thickness;
    providing a carrier substrate;
    providing an adhesive layer between the first surface of the silicon carbide substrate and the carrier substrate;
    connecting the carrier substrate to the first surface of the silicon carbide substrate with the adhesive layer;
    thinning the silicon carbide substrate to a second thickness less than the first thickness;
    providing a metal layer on the thinned silicon carbide substrate opposite the first surface of the silicon carbide substrate;
    annealing the metal layer to form an ohmic contact on the thinned silicon carbide substrate opposite the first surface of the silicon carbide substrate; and
    singulating the silicon carbide substrate to provide a singulated semiconductor device.

2. The method of claim 1, wherein thinning the silicon carbide substrate comprises grinding and/or lapping the silicon carbide substrate while the carrier substrate is providing mechanical support to the silicon carbide substrate.

3. The method of claim 2, wherein thinning the silicon carbide substrate comprises grinding the silicon carbide substrate using an in-feed and/or creep feed grinder while the carrier substrate is providing mechanical support to the silicon carbide substrate.

4. The method of claim 1, wherein thinning the silicon carbide substrate comprises etching the silicon carbide substrate while the carrier substrate is providing mechanical support to the silicon carbide substrate.

5. The method of claim 1, wherein providing the semiconductor device comprises forming a passivation layer on the first surface of the silicon carbide substrate, and wherein connecting the carrier substrate to the first surface of the silicon carbide substrate comprises attaching the carrier substrate to the passivation layer.

6. The method of claim 1, wherein annealing the metal layer comprises:
    locally heating the deposited metal layer to a temperature that is sufficient to cause the the metal layer to form an ohmic contact to the surface of the silicon carbide substrate opposite the first surface but that is lower than a temperature at which the carrier substrate will detach from the silicon carbide substrate.

7. The method of claim 6, wherein locally heating the deposited metal layer comprises laser annealing the deposited metal layer.

8. The method of claim 7, wherein the SiC substrate comprises 4H SiC and/or 6H SiC, and wherein laser annealing comprises impinging laser light on the deposited metal layer, the laser light having a wavelength of about 248 nanometers to about 308 nanometers.

9. The method of claim 8, wherein the SiC substrate comprises 6H SiC, and wherein the laser light is applied in a single pulse.

10. The method of claim 9, wherein the single pulse has a duration of about 30 nanoseconds.

11. The method of claim 9, wherein the laser light is applied at an energy of about 2.8 joules/cm$^2$.

12. The method of claim 8, wherein the SiC substrate comprises 4H SiC, and wherein the laser light is applied in a plurality of pulses.

13. The method of claim 12, wherein the laser light is applied in about five pulses each having a duration of about 30 nanoseconds.

14. The method of claim 12, wherein the laser light is applied at an energy of about 4.2 joules/cm$^2$.

15. The method of claim 7 wherein laser annealing comprises impinging laser light having photon energies above a bandgap of the SiC substrate.

16. The method of claim 7 wherein laser annealing comprises impinging pulsed or continuous wave laser light.

17. The method of claim 6, wherein locally heating the deposited metal layer comprises directing an electron beam at the metal layer.

18. The method of claim 1, further comprising forming a metal overlayer on the ohmic contact, wherein the metal overlayer comprises an adhesion layer comprising Ti, a barrier layer comprising Ni and/or Ti/W, and a bonding layer comprising Ag and/or Au.

19. The method of claim 1, wherein thinning the substrate comprises thinning the substrate to a thickness of about 120 microns or less.

20. The method of claim 19, wherein thinning the substrate comprises thinning the substrate to a thickness of about 80 microns to about 100 microns.

21. The method of claim 1, wherein providing the adhesive layer comprises providing the adhesive layer on the first surface of the silicon carbide substrate.

22. The method of claim 1, wherein providing the adhesive layer comprises providing the adhesive layer on the substrate.

23. A method of forming a silicon carbide semiconductor device, comprising:
    providing an epitaxial layer on a surface of a silicon carbide substrate;
    providing a semiconductor device at a first surface of the epitaxial layer opposite the silicon carbide substrate;
    providing a carrier substrate;
    providing an adhesive layer between the carrier substrate and the first surface of the epitaxial layer;
    connecting the carrier substrate to the first surface of the epitaxial layer with the adhesive layer;
    removing the silicon carbide substrate to expose a second surface of the epitaxial layer opposite the first surface;
    providing a metal layer on the second surface of the epitaxial layer;
    annealing the metal layer to form an ohmic contact on the second surface of the epitaxial layer; and
    separating the epitaxial from the carrier substrate.

24. The method of claim 23, wherein removing the silicon carbide substrate comprises grinding and/or lapping the silicon carbide substrate while the carrier substrate is providing mechanical support to the epitaxial layer.

25. The method of claim 24, wherein removing the silicon carbide substrate comprises grinding the silicon carbide substrate using an in-feed and/or creep feed grinder while the carrier substrate is providing mechanical support to the epitaxial layer.

26. The method of claim 23, wherein removing the silicon carbide substrate comprises etching the silicon carbide substrate while the carrier substrate is providing mechanical support to the epitaxial layer.

27. The method of claim 23, wherein providing the semiconductor device comprises forming a passivation layer on the first surface of the epitaxial layer, and wherein connecting the carrier substrate to the first surface of the epitaxial layer comprises attaching the carrier substrate to the passivation layer.

28. The method of claim 23, wherein annealing the metal layer comprises:

locally heating the deposited metal layer to a temperature that is sufficient to cause the metal layer to form an ohmic contact to the surface of the silicon carbide substrate opposite the first surface but that is lower than a temperature at which the carrier substrate will detach from the epitaxial layer.

29. A method of forming a silicon carbide power semiconductor device, comprising:

providing a semiconductor device at a first surface of a silicon carbide substrate having a first thickness greater than about 300 microns;

providing a carrier substrate;

providing an adhesive layer between the first surface of the silicon carbide substrate and the carrier substrate;

connecting the carrier substrate to the first surface of the silicon carbide substrate with the adhesive layer;

thinning the silicon carbide substrate to a second thickness of less than about 150 microns; and providing an ohmic contact on the thinned silicon carbide substrate opposite the first surface of the thinned silicon carbide substrate.

30. The method of claim 29, wherein providing the ohmic contact comprises:

providing a metal layer on the thinned silicon carbide substrate opposite the first surface of the silicon carbide substrate; and annealing the metal layer to form an ohmic contact on the thinned silicon carbide substrate opposite the first surface of the silicon carbide substrate.

31. The method of claim 30, wherein annealing the metal layer comprises:

locally heating the deposited metal layer to a temperature that is sufficient to cause the metal layer to form an ohmic contact to the surface of the silicon carbide substrate opposite the first surface but that is lower than a temperature at which the carrier substrate will detach from the silicon carbide substrate.

32. The method of claim 31, wherein locally heating the deposited metal layer comprises laser annealing the deposited metal layer.

33. The method of claim 32 wherein the SiC substrate comprises 4H siC and/or 6H SiC, and wherein laser annealing comprises impinging laser light on the deposited metal layer, the laser light having a wavelength of about 248 nanometers to about 308 nanometers.

34. The method of claim 33, wherein the SiC substrate comprises 6H SiC, and wherein the laser light is applied in a single pulse having a duration of about 30 nanoseconds, and wherein the laser light is applied at an energy of about 2.8 joules/cm$^2$.

35. The method of claim 33, wherein the SiC substrate comprises 4H SiC, and wherein the laser light is applied in a about five pulses each having a duration of about 30 nanoseconds, and wherein the laser light is applied at an energy of about 4.2 joules/cm$^2$.

36. The method of claim 31, wherein locally heating the deposited metal layer comprises directing an electron beam at the metal layer.

* * * * *

UNITED STATES PATENT AND TRADEMARK OFFICE
CERTIFICATE OF CORRECTION

| | |
|---|---|
| PATENT NO. | : 7,547,578 B2 |
| APPLICATION NO. | : 11/531975 |
| DATED | : June 16, 2009 |
| INVENTOR(S) | : Agarwal et al. |

It is certified that error appears in the above-identified patent and that said Letters Patent is hereby corrected as shown below:

Column 12, Claim 18, Line 20: Please correct "abonding" to read -- a bonding --

Column 12, Claim 22, Line 32: Please correct "the substrate" to read -- the carrier substrate --

Column 14, Claim 35, Lines 26-27: Please correct "applied in a about five pulses" to read -- applied in about five pulses --

Signed and Sealed this

Seventeenth Day of November, 2009

David J. Kappos
*Director of the United States Patent and Trademark Office*